United States Patent
Hoffmann et al.

(10) Patent No.: US 7,256,735 B2
(45) Date of Patent: Aug. 14, 2007

(54) SATELLITE AMPLIFIER SYSTEM

(75) Inventors: Matthieu Hoffmann, Flourens (FR); Philippe Voisin, Toulouse (FR)

(73) Assignee: Thales, Neuilly sur Seine (FR)

( * ) Notice: Subject to any disclaimer, the term of this patent is extended or adjusted under 35 U.S.C. 154(b) by 339 days.

(21) Appl. No.: 10/886,611

(22) Filed: Jul. 9, 2004

(65) Prior Publication Data

US 2005/0227617 A1 Oct. 13, 2005

(30) Foreign Application Priority Data

Jul. 11, 2003 (FR) .................................. 03 08522

(51) Int. Cl.
*H04B 7/185* (2006.01)
(52) U.S. Cl. ...................... 342/373; 342/374; 455/13.3
(58) Field of Classification Search ................ 342/354, 342/368, 373, 374; 455/12.1, 13.3
See application file for complete search history.

(56) References Cited

U.S. PATENT DOCUMENTS

| | | | |
|---|---|---|---|
| 4,839,894 A * | 6/1989 | Rudish et al. .............. 370/497 |
| 5,289,193 A | 2/1994 | Lenormand et al. |
| 5,638,024 A | 6/1997 | Dent et al. |
| 5,917,371 A | 6/1999 | Chesarek et al. |
| 5,955,920 A | 9/1999 | Reudink et al. |
| 6,340,948 B1 * | 1/2002 | Munoz-Garcia et al. .... 342/373 |
| 2004/0259497 A1 * | 12/2004 | Dent ......................... 455/13.3 |

FOREIGN PATENT DOCUMENTS

DE 195 49 356 A1 10/1996

* cited by examiner

*Primary Examiner*—Dao L. Phan
(74) *Attorney, Agent, or Firm*—Sughrue Mion, PLLC

(57) ABSTRACT

A satellite amplifier system 100 adapted to amplify and distribute flexibly P input transmission channels to N outputs each corresponding to one beam includes a switch 102 having at least P inputs for routing the plurality P of transmission channels to a plurality of outputs, at least one Butler matrix 103 each input of which is connected to an output of the switch, and at least one inverse Butler matrix 104, each output of the Butler matrix being connected to a corresponding input of the inverse Butler matrix by an amplifier 105. The system 100 further includes a plurality of output demultiplexers 109 for separating a plurality of transmission channels by frequency, the input of each of the output demultiplexers being connected to an output of the inverse Butler matrix.

4 Claims, 5 Drawing Sheets

SATELLITE AMPLIFIER SYSTEM

BACKGROUND OF THE INVENTION

The present invention relates to a satellite amplifier system adapted to distribute a plurality of received transmission channels flexibly to a plurality of output beams.

In the general case of space missions, evolution of satellite transmissions to users equipped with small send/receive terminals of low capacity implies increasing the receive quality of the onboard segment and increasing the power of the signals retransmitted to the ground. These performance improvements are obtained by increasing the gain of the onboard antennas, which can be achieved only by reducing the dimensions of their coverages on the ground. To cover a particular geographical coverage region on the ground, these coverage reductions necessitate the generation of a plurality of beams or spots in order to sample the geographical region. This kind of multibeam or multispot coverage enables connections with small ground terminals but give rise to the problem of managing onboard capacities and more particularly of allocating received channels to the transmitted beams as a function of:

different traffic densities, and
changing traffic densities.

Accordingly, in a manner that is known in the art and represented diagrammatically in the architecture 1 shown in FIG. 1, a satellite receives 64 signals each corresponding to one transmission channel and supplies 32 beams. The 64 channels are processed by an input section 2 which:

handles low-noise reception, appropriate frequency conversion and appropriate filtering for each of the 64 transmission channels, and
outputs each of the 64 channels to an amplifier 3.

A transmission channel corresponds to a transmission frequency band and may correspond to a single carrier or to a set of carriers or sub-channels.

Each transmission channel is amplified by the associated amplifier 3. The amplifiers 3 are high-power amplifiers and generally take the form of traveling wave tube or solid state amplifiers. To provide a plurality of channels for each beam, it is necessary to combine the channels by means of output multiplexers (OMUX) 4. The output multiplexer 4 provided at the output of each amplifier is described in "Satellite Communications Systems" (G. Maral and M. Bousquet, WILEY, second edition, page 411 et seq.). The multiplexer 4 comprises filters and a common guide that is adapted to combine the transmission channels after amplification. In FIG. 1, each output multiplexer 4 receives two transmission channels and supplies one beam signal. Each beam signal is then sent to a source, not shown, such as a horn that radiates toward a reflector, not shown, to form the beam. Thus an architecture of this kind provides two transmission channels per downlink beam.

However, operators do not always have a very clear view of the future distribution of traffic (and therefore of power) over the coverages addressed and therefore need some flexibility for adapting during the service life of the satellite to traffic requirements resulting from the demand for and the success of services in different geographical regions. It is therefore important to be able to route transmission channels to beams flexibly, i.e. so that the total number of channels processed by the payload can be distributed to the various beams in accordance with traffic demand throughout the service life of the satellite. In this sense, the architecture as shown in FIG. 1 provides no flexibility in terms of the number of channels allocated to each beam and requires a number of amplifiers that is imposed by the number of channels to be amplified.

One prior art solution to this problem consists, as shown in FIG. 2, in using a multiport amplifier (MPA) 10 to provide flexible amplification and allocation of 64 transmission channels to 32 beams. The system 10 comprises:

an input section 11 with 64 inputs and 64 outputs, which, like the section 2, handles low-noise reception, appropriate frequency conversion and appropriate filtering for each of the 64 transmission channels,
a switch 12 with 64 inputs and 32 outputs,
a Butler matrix 13 with 32 inputs and 32 outputs,
an inverse Butler matrix 14 with 32 inputs and 32 outputs, and
32 high-power amplifiers 15, each output of the matrix 13 being connected to the corresponding input of the matrix 14 via a high-power amplifier 15.

The transfer function of the inverse Butler matrix 14 is the inverse of that of the Butler matrix 13.

Thus the input section 11 receives 64 uplink transmission channels and:

handles low-noise reception, appropriate frequency conversion and appropriate filtering of each of the 64 transmission channels, and
outputs the 64 transmission channels to the 64 inputs of the switch 12.

The switch 12 is a low level (i.e. low power) switch, generally an electromechanical or electronic switch, and merely routes the channels present at its 64 inputs to its 32 outputs and multiplexes them (summation of a plurality of channels at the same output). The complexity of the switch 12 depends on the required flexibility, as reflected in the number of outputs to which each channel may be routed and the number of channels that may be routed to the some output.

The output signals of the switch 12, which may correspond to a plurality of channels, are then sent to the 32 inputs of the Butler matrix 13.

In the Butler matrix 13, which is made up of 3 dB couplers, the signal at each output is a combination of the signals at all the inputs, but the signals coming from the diverse inputs have a predetermined phase, different from one input to another, which means that the input signals may be reconstituted in their entirety after amplification by the amplifiers 15 and passing through the inverse Butler matrix 14. In other words, the 32 output signals of the switch are obtained identically, after amplification, at the output ports of the inverse Butler matrix 14 (identity product of the Butler matrix 13 by the inverse Butler matrix 14). Each amplifier 15 contributes to the amplification of all the signals present at the inputs of the Butler matrix 13. Rated to pass a maximum number of transmission channels, a system 10 of the above kind authorizes any distribution thereof.

Each beam signal obtained at the outputs of the inverse Butler matrix 14 is then sent to a source, not shown, such as a horn that radiates toward a reflector, not shown, to form the beam.

Thus the system 10 provides total flexibility in that it is functionally possible to allocate each of the 64 transmission channels to each of the 32 beams. It is thus functionally possible to place all the amplified transmission channels on a single beam or to distribute them equally between the beams, which are allocated on the upstream side of the Butler matrices by the switch 12.

However, using this kind of solution gives rise to certain problems, in particular the problem of the feasibility of a high order MPA system, which is linked to the feasibility of the Butler matrices and the parallel connection of a large number of power amplifiers, together with a loss of efficiency in terms of the energy efficiency of the system 10 from FIG. 2 compared to the system 1 from FIG. 1.

Thus it is common to encounter up to 64 or more beams to provide the coverage of a continent (multimedia application in the Ka band). In this case, MPA systems with 64 inputs and 64 outputs, or even 64 inputs and 32 outputs, as shown in FIG. 2, are extremely difficult to implement, in particular because of the complexity of the Butler matrices used.

One option is to divide the Butler matrices 13 and 14 by using a plurality of subgroups of smaller Butler matrices. For example, FIG. 3 shows a system of this kind identical to the system 10 from FIG. 2 except that the FIG. 2 matrices 13 and 14 have been divided into two identical sub-matrices with 16 inputs and 16 outputs. This kind of solution is less flexible, however, in that, to avoid overspecifying the power amplifiers, it is not possible to amplify the 64 transmission channels in the same submatrix. To use the same amplifiers as the system 10 from FIG. 2, the number of channels processed by each submatrix must not exceed 32 and the system 12 must therefore divide the 64 channels between two blocks each of 32 channels. This constraint limits the flexibility of the FIG. 3 system compared to that of the FIG. 2 system 10.

Furthermore, it should be noted that, in an MPA type solution, the number of inputs and outputs of the Butler and inverse Butler matrices must be at least equal to the number of beams, to enable connection of all the beam ports to the output of the MPA system. Thus the number of amplifiers required is imposed by the number of beams, which is reflected in high cost and a complex arrangement.

Finally, if all the channels are transmitted via an MPA system, each power amplifier contributes to the amplification of a large number of channels (64 channels per amplifier for the FIG. 2 system 10 compared to the one channel per amplifier for the FIG. 1 system 1). This multichannel operation is reflected in the obligatory operation of the power amplifier far from its saturation point, which is in turn reflected in a loss in its energy efficiency (power delivered/power consumed) and therefore in a significant increase in the power consumed by the system 10 for exactly the same power delivered per transmission channel as for the systems 1 and 10. The increased flexibility of the system 10 compared to the system 1 is therefore reflected in a degraded energy balance.

SUMMARY OF THE INVENTION

The present invention aims to provide a satellite system adapted to amplify and distribute P input transmission channels flexibly to N outputs each corresponding to a beam using a reduced number of power amplifiers but retaining good flexibility.

To this end the present invention proposes a satellite system adapted to amplify and distribute P input transmission channels flexibly to N outputs each corresponding to one beam, said system comprising:
  a switch having at least P inputs for routing said P transmission channels to a plurality of outputs,
  at least one Butler matrix each input of which is connected to an output of said switch,
  at least one inverse Butler matrix, each output of said Butler matrix being connected to a corresponding input of said inverse Butler matrix by an amplifier, said system being characterized in that it comprises a plurality of output demultiplexers for separating a plurality of transmission channels by frequency, the input of each of said output demultiplexers being connected to an output of said inverse Butler matrix.

Thanks to the invention, the advantageous combination of using the multiport amplifier (MPA) technology and output demultiplexers (ODEMUX) enables the transmission channels to be allocated to a number of beams greater than the number of inputs of the Butler matrix (N>P). Thus by providing an ODEMUX (which has at least two outputs) at each output of the inverse Butler matrix, the number of Butler matrix inputs is necessarily less than or equal to half the number of beams. The ODEMUX enables separation by frequency at the same output port of the inverse Butler matrix of signals at different frequencies to be used for different beams. Thus an output port may address two beams if the ODEMUX has two outputs.

Furthermore, to arrive at a solution equivalent to that obtained with the MPA or divided MPA technology, the system of the invention necessitates not more than half the number of amplifiers (for an ODEMUX with two outputs), assuming that the power demanded of each amplifier, which is at least twice that demanded using the MPA or divided MPA technology, can actually be provided by a single amplifier. If this were not the case, the number of amplifiers of the system of the invention would be at most equal to that obtained using the MPA or divided MPA technology.

Moreover, the level of flexibility is increased relative to a divided MPA solution. Accordingly, to assure the same flexibility (for example on 32 beams), the divided MPA solution necessitates two subgroups each comprising a Butler matrix with 16 inputs and 16 outputs and an inverse Butler matrix with 16 inputs and 16 outputs. Flexibility is assured only within each of the two subgroups, and thus in relation to only eight beams in the same subgroup. The system of the invention addresses the 32 beams with only one Butler matrix with 16 inputs and 16 outputs and only one inverse Butler matrix with 16 inputs and 16 outputs, flexibility being provided toward the 32 beams.

The present invention therefore enables the use of MPA of reasonable order but compatible with the generation of a large number of beams.

In one embodiment, said system comprises:
  a switch with P inputs and Q outputs for routing said P transmission channels to said Q outputs,
  k1 Butler matrices each having Q/k1 inputs and Q/k1 outputs, where k1 is a non-zero natural integer and Q is an integer multiple of k1,
  k1 inverse Butler matrices each having Q/k1 inputs and Q/k1 outputs, each output of each of the k1 Butler matrices being connected to a corresponding input of one of the k1 inverse Butler matrices via an amplifier, and
  Q output demultiplexers each having one input and k2 outputs, each of said Q/k1 outputs associated with each inverse Butler matrix being connected to the input of one of said Q demultiplexers, and k2 being a non-zero natural integer such that N is equal to Q.k2.

The present invention further provides a satellite amplifier system adapted to distribute flexibly a number P of input transmission channels, said system comprising a number P' of inputs for receiving P' input transmission channels, said number P' of inputs being greater than said number P of input transmission channels to be distributed flexibly, and said system being characterized in that it comprises:

a system according to the invention adapted to amplify and distribute flexibly P input transmission channels, a plurality of amplifiers for amplifying the remaining P'-P transmission channels.

Thus this system architecture is partway between an inflexible solution and a flexible solution using the system of the invention. It has an acceptable energy efficiency and good flexibility over a non-negligible number P of channels. This kind of solution achieves a good compromise between the required flexibility and overall efficiency.

This architecture makes it possible to associate this system with a standard amplification scheme (as shown in FIG. 1), providing flexibility over all the beams combined with management of the total energy balance.

The amplifier system advantageously comprises a plurality of output multiplexers, each of said output multiplexers having an input connected to an output of one of said amplifiers to amplify said remaining P'-P transmission channels and another input connected to the system according to the invention, which manages flexibly the P transmission channels.

BRIEF DESCRIPTION OF THE DRAWINGS

Other features and advantages of the present invention will become apparent in the course of the following description of embodiments of the invention, which is given by way of illustrative and non-limiting example. In the drawings.

DETAILED DESCRIPTION OF THE INVENTION

Figure 1:
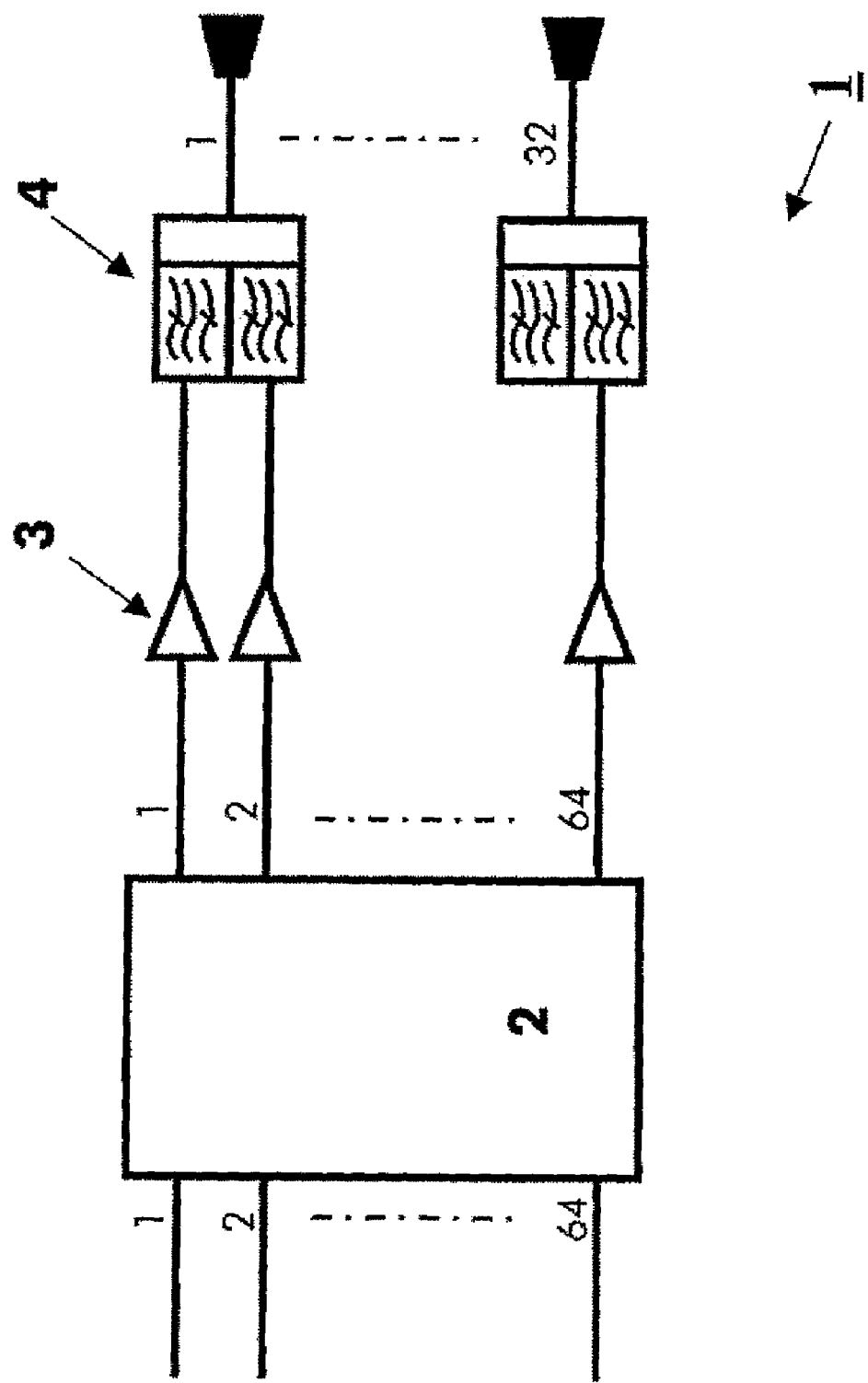
FIG. 1 represents diagrammatically a prior art amplification architecture.
Figure 2:
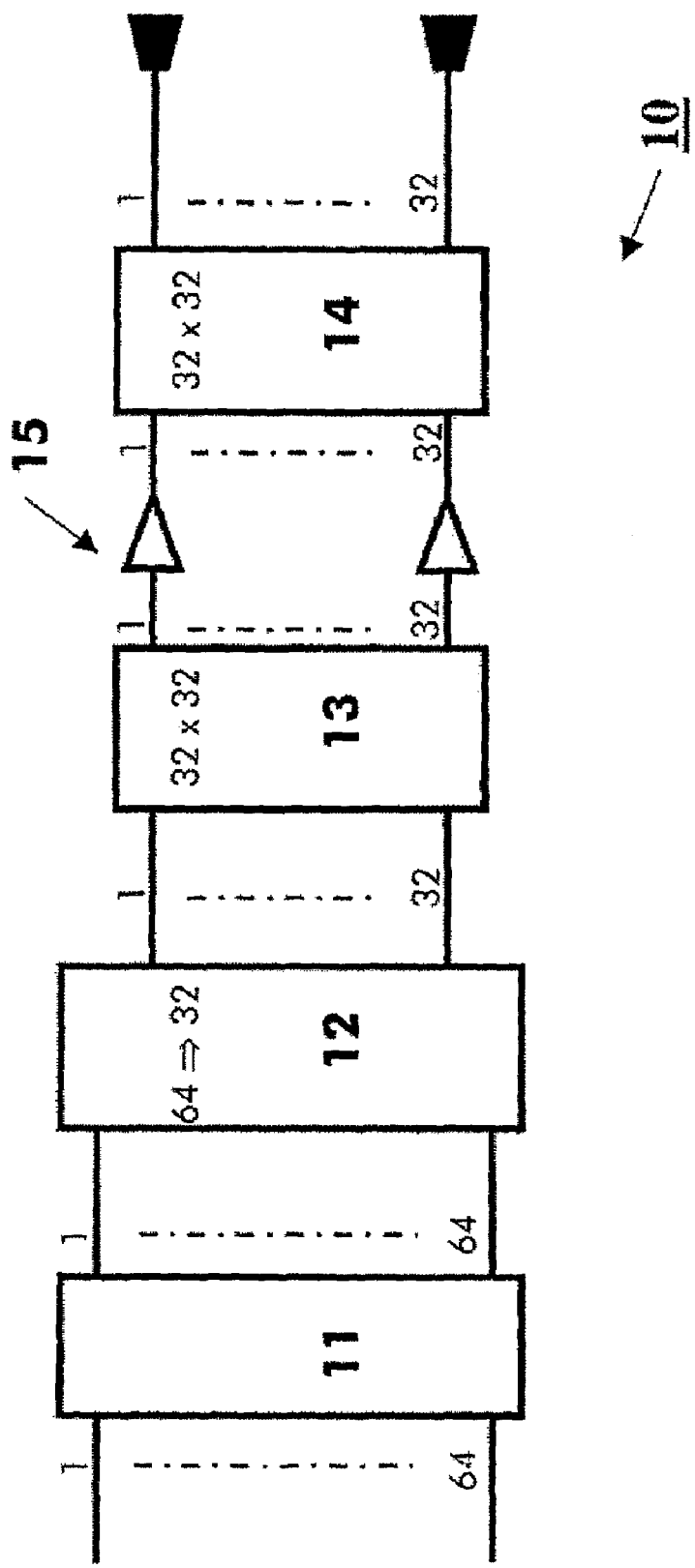
FIG. 2 represents diagrammatically a first embodiment of a prior art flexible amplification and allocation system.
Figure 3:
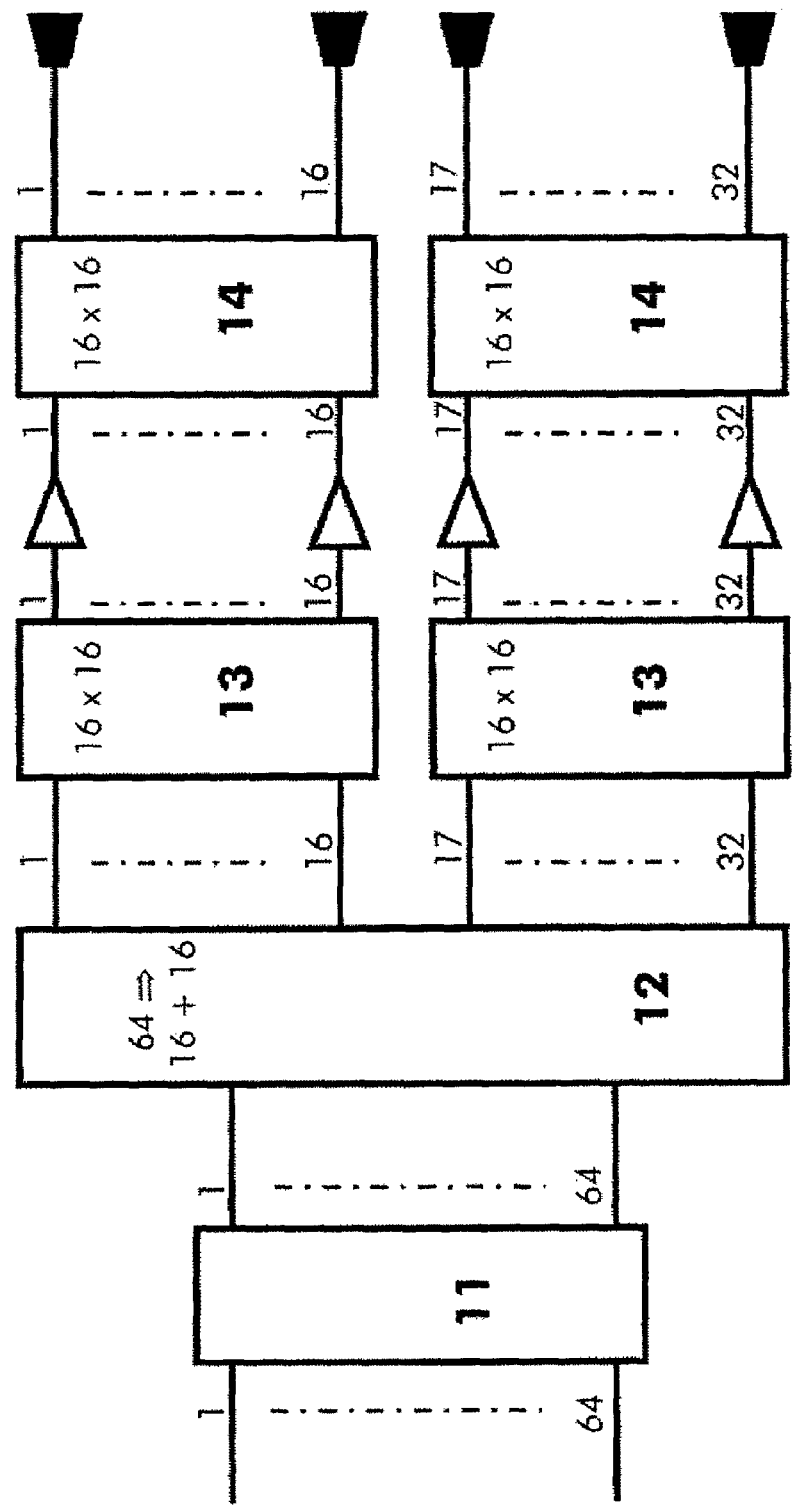
FIG. 3 represents diagrammatically a second embodiment of a prior art flexible amplification and allocation system.

FIGS. 1, 2 and 3 have already been described with reference to the prior art.

Figure 4:
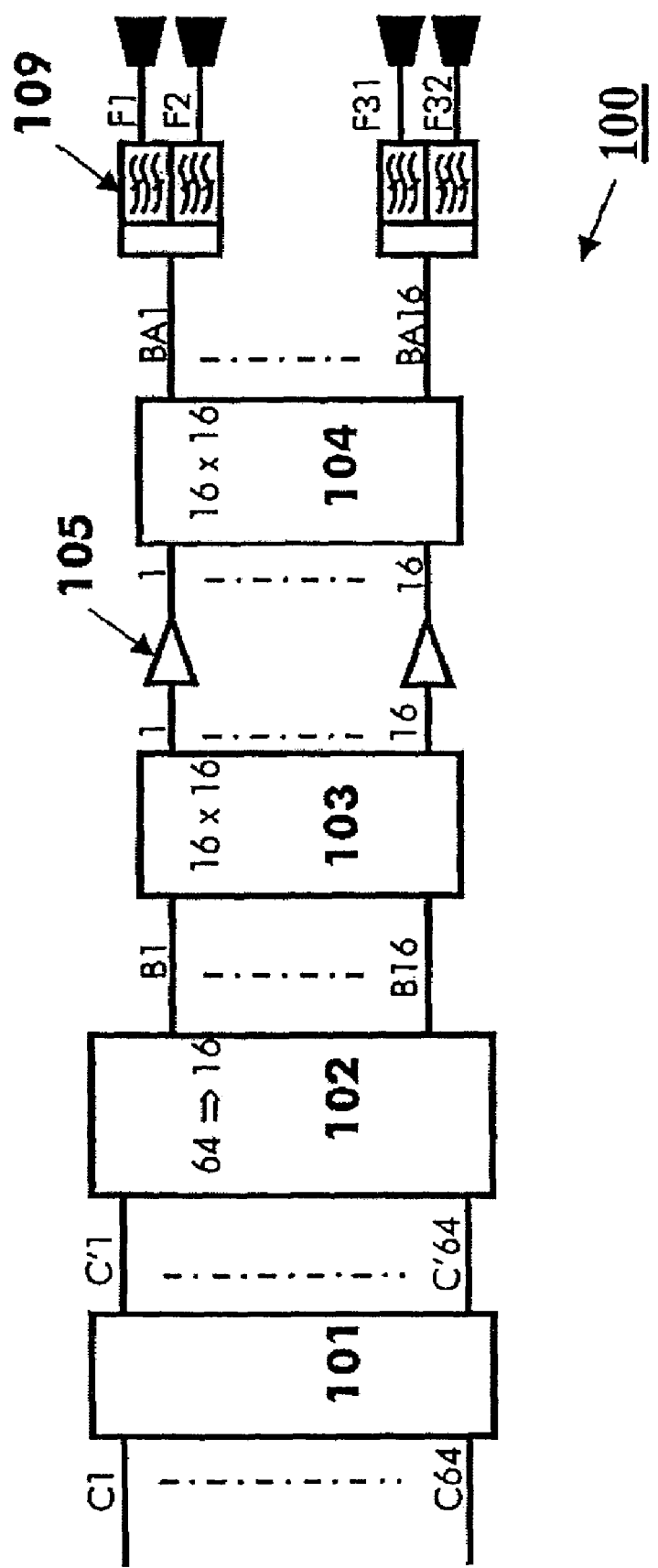
FIG. 4 represents diagrammatically a satellite system of the invention.

FIG. 4 represents a system 100 adapted to amplify and distribute flexibly 64 (P=64) input channel signals C1 to C64 to 32 (N=32) output signals F1 to F32 each corresponding to one beam.

The system 100 comprises:

an input section 101 with 64 inputs and 64 outputs, a switch 102 with 64 (P=64) inputs and 16 (Q=16) outputs, one Butler matrix 103 (k1=1) with 16 (Q/k1=16) inputs and 16 outputs, one inverse Butler matrix 104 (k1=1) with 16 (Q/k1=16) inputs and 16 outputs, 16 (Q=16) power amplifiers 105, and 16 (Q=16) output demultiplexers (ODEMUX) 109 having one input and two (k2=2) outputs.

Each ODEMUX 109 is a system for separating by frequency at its output the plurality of channels present at its input. In structural terms, an ODEMUX is an inverted output multiplexer (OMUX) as described in "Satellite Communications Systems" (G. Maral and M. Bousquet, WILEY, second edition, page 411 et seq.).

Each of the power amplifiers 105 is generally a traveling wave tube amplifier, but it may equally be a solid state power amplifier (SSPA).

Each output of the matrix 103 is connected to the corresponding input of the matrix 104 via one of the power amplifiers 105.

The transfer function of the inverse Butler matrix 104 is the inverse of that of the Butler matrix 103.

Thus the input section 101 receives 64 uplink transmission channels C1 to C64. The input section 101 then carries out the following operations:

appropriate frequency conversion and filtering of each of the 64 transmission channels C1 to C64, application of 64 transmission channels C'1 to C'64 to the 64 inputs of the switch 102.

The switch 102 is a low-level switch (i.e. a switch operating at very low power), generally an electromechanical or electronic switch, which merely combines signals present at its inputs and routes them to one of its 16 outputs.

The output signals B1 to B16 of the switch 102, which may correspond to a plurality of channel signals, are then sent to the 16 inputs of the Butler matrix 103.

The signal at each output of the Butler matrix 103, which is formed of 3 dB couplers, is a combination of the signals at all the inputs, but the signals at the various inputs have different predetermined phases, which means that the input signals may be reconstituted in their entirety after amplification by the amplifiers 105 and passing them through the inverse Butler matrix 104.

Thus the signals at the output ports of the inverse Butler matrix 104 are identical to the 16 output signals B1 to B16 of the switch 101, after amplification, because of the identity product of the Butler matrix 103 and the inverse Butler matrix 104.

Each amplifier 105 contributes to the amplification of all the signals B1 to B16 present at the inputs of the Butler matrix 103. Of course, the amplifiers 105 are rated to pass a predetermined maximum number of channels.

Let BA1 to BA16 denote the amplified signals obtained at the output ports of the inverse Butler matrix 104.

Each signal BA1 to BA16 arrives at an input of a corresponding ODEMUX 109 and is separated, according to its frequency, by that ODEMUX. The 16 ODEMUX 109 thus supply 32 signals F1 to F32 each corresponding to one beam.

Each signal F1 to F32 obtained at the outputs of the system 100 is then sent to a source, not shown, such as a horn, which radiates toward a reflector, not shown, to form the beam.

Each signal BA1 to BA16 may comprise a plurality of transmission channels. Of course, the transmission channels at the inputs of the ODEMUX must have sufficient frequency spacing to be demultiplexed. However, this constraint is in practice resolved implicitly in that, in a multibeam system, the system constraints also impose a frequency separation of the channels between adjacent beams. This being so, two adjacent beams corresponding, for example, to two outputs of an ODEMUX 109 having to comprise clearly separated channel signals, the channels are also sufficiently separated to allow demultiplexing.

The system 100 of the invention uses 16 amplifiers, i.e. half the number of amplifiers of the prior art system 10 shown in FIG. 2.

Note that a switch with 64 inputs and eight outputs, a single Butler matrix, a single inverse Butler matrix, each matrix having eight inputs and eight outputs, and ODEMUX with four demultiplexed outputs may be used. In this case there are eight amplifiers, representing a fourfold improvement over the FIG. 2 system 10.

Note further that a greater number k1 of Butler and inverse Butler matrices may be used (for example two (k1=2) 16×16 Butler matrices and two 16×16 inverse Butler matrices).

Figure 5:
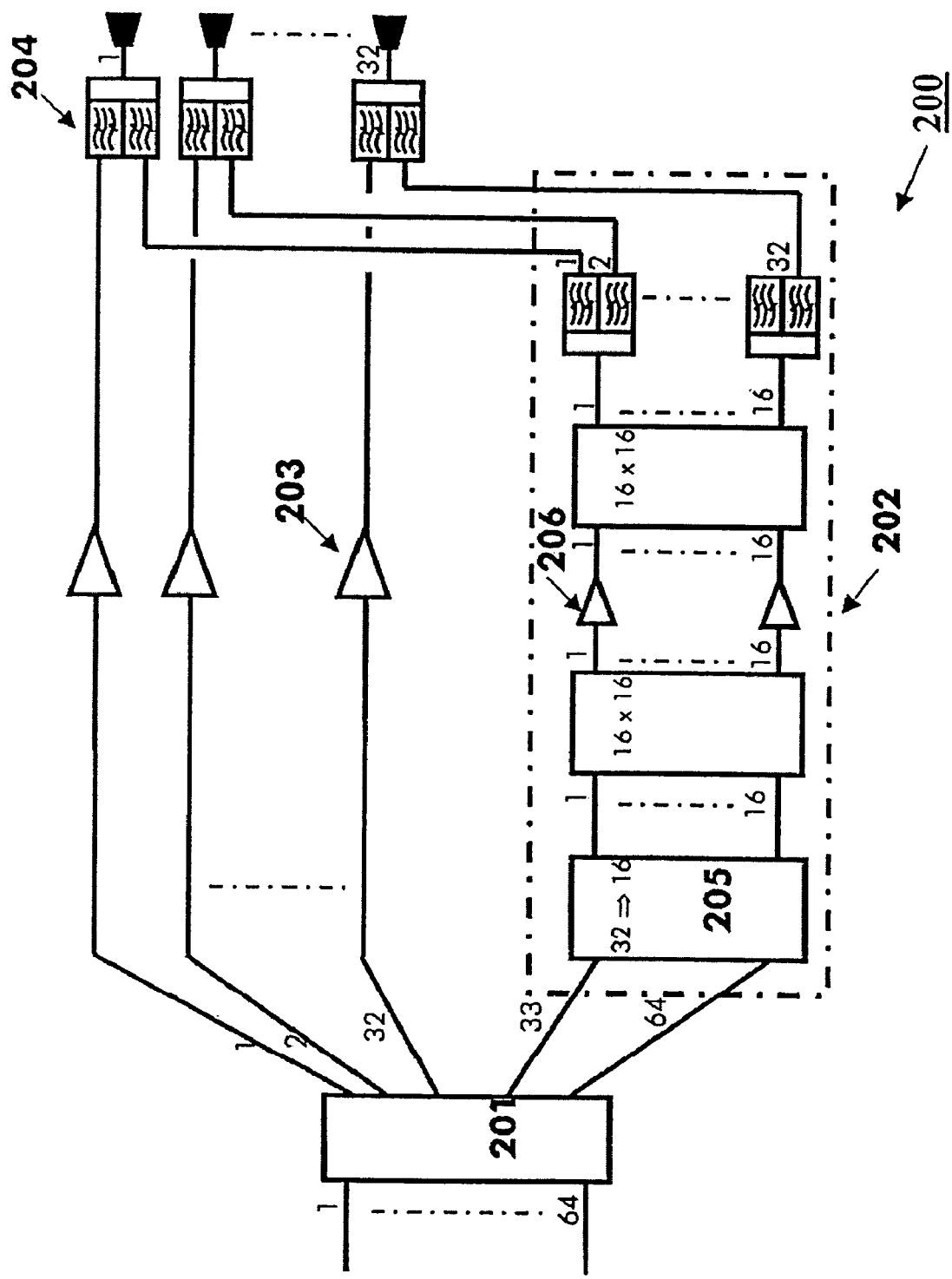
FIG. 5 represents diagrammatically an amplification system of the invention.

FIG. 5 represents diagrammatically an amplifier system 200 according to the invention.

The amplifier system 200 comprises:
an input section 201 having 64 inputs and 64 outputs,
32 amplifiers 203,
a module 202 having 32 inputs and 32 outputs, and
32 output multiplexers 204.

The input section 201 receives 64 uplink transmission channels. The input section 201 then carries out the following operations:
appropriate frequency conversion of each of the 64 transmission and filtering channels, and
production of two blocks of 32 channels.

The first 32 transmission channels at the output of the input section 201 are each injected directly into the input of one of the 32 amplifiers 203.

The other 32 transmission channels are injected into the input of the module 202.

The module 202 has a structure identical to that of the system 100 shown in FIG. 4, for example, except that it has no input section and its switch 205 has 32 inputs (instead of the 64 inputs of the system 100).

The module 202 amplifies and distributes flexibly to its 32 outputs the transmission channels at its 32 inputs.

Each output signal of the module 202 may then be multiplexed with an output signal of an amplifier 203 by an output multiplexer 204.

The 32 output multiplexers 204 thus supply 32 output signals each corresponding to one beam.

The module 202 comprises 16 amplifiers 206. Thus, with 48 amplifiers, the system 200 ensures very flexible distribution of 32 transmission channels (i.e. half the transmission channels) over 32 beams whilst preserving a high overall efficiency in that only some of the channels are managed flexibly.

By way of comparison, the energy efficiency of this kind of system lies between the efficiency of an inflexible equivalent system such as that shown in FIG. 1 and a totally flexible system such as that shown in FIG. 2.

Of course, the invention is not limited to the embodiment that has just been described.

In particular, the invention has been described with ODEMUX having two outputs, but it is equally possible to use ODEMUX having more than two outputs (for example four outputs).

Similarly, the switches used have been described as being electromechanical switches, but they may equally be electronic switches.

The invention claimed is:

1. A satellite system adapted to amplify and distribute P input transmission channels flexibly to N outputs each corresponding to one beam, said system comprising:
a switch having at least P inputs for routing said P transmission channels to a plurality of outputs,
at least one Butler matrix each input of which is connected to an output of said switch,
at least one inverse Butler matrix, each output of said Butler matrix being connected to a corresponding input of said inverse Butler matrix by an amplifier,
said system being characterized in that it comprises a plurality of output demultiplexers for separating a plurality of transmission channels by frequency, the input of each of said output demultiplexers being connected to an output of said inverse Butler matrix.

2. A system according to claim 1, characterized in that it comprises:
a switch with P inputs and Q outputs for routing said P transmission channels to said Q outputs,
k1 Butler matrices each having Q/k1 inputs and Q/k1 outputs, where k1 is a non-zero natural integer and Q is an integer multiple of k1,
k1 inverse Butler matrices each having Q/k1 inputs and Q/k1 outputs, each output of each of the k1 Butler matrices being connected to a corresponding input of one of the k1 inverse Butler matrices via an amplifier, and
Q output demultiplexers each having one input and k2 outputs, each of said Q/k1 outputs associated with each inverse Butler matrix being connected to the input of one of said Q demultiplexers, and k2 being a non-zero natural integer such that N is equal to Q.k2.

3. A satellite amplifier system adapted to distribute flexibly a number P of input transmission channels, said system comprising a number P' of inputs for receiving P' input transmission channels, said number P' of inputs being greater than said number P of input transmission channels to be distributed flexibly, and said system being characterized in that it comprises:
a satellite system according to claim 1 adapted to amplify and distribute flexibly P input transmission channels,
a plurality of amplifiers for amplifying the remaining P'-transmission channels.

4. An amplifier system according to claim 3, characterized in that it comprises a plurality of output multiplexers, each of said output multiplexers having an input connected to an output of one of said amplifiers to amplify said remaining P'-P transmission channels and another input connected to said satellite system.

* * * * *